(12) United States Patent
Shalvi et al.

(10) Patent No.: US 7,821,826 B2
(45) Date of Patent: Oct. 26, 2010

(54) MEMORY CELL READOUT USING SUCCESSIVE APPROXIMATION

(75) Inventors: Ofir Shalvi, Ra'anana (IL); Naftali Sommer, Rishon Le-Zion (IL)

(73) Assignee: Anobit Technologies, Ltd., Herzilia Pituach (IL)

(*) Notice: Subject to any disclaimer, the term of this patent is extended or adjusted under 35 U.S.C. 154(b) by 16 days.

(21) Appl. No.: 11/995,805

(22) PCT Filed: Oct. 30, 2007

(86) PCT No.: PCT/IL2007/001316
§ 371 (c)(1),
(2), (4) Date: Jan. 15, 2008

(87) PCT Pub. No.: WO2008/053473
PCT Pub. Date: May 8, 2008

(65) Prior Publication Data
US 2010/0110787 A1    May 6, 2010

Related U.S. Application Data

(60) Provisional application No. 60/863,506, filed on Oct. 30, 2006.

(51) Int. Cl.
*G11C 16/04* (2006.01)
(52) U.S. Cl. ............... 365/185.03; 365/185.01; 365/185.18; 365/185.25
(58) Field of Classification Search ............ 365/185.03, 365/185.01, 185.25, 185.18
See application file for complete search history.

(56) References Cited

U.S. PATENT DOCUMENTS

| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |

(Continued)

FOREIGN PATENT DOCUMENTS

EP        0783754 B1    7/1997

(Continued)

OTHER PUBLICATIONS

JEDEC Standard JESD84-C44, "Embedded MultiMediaCard (e•MMC) Mechanical Standard, with Optional Reset Signal", JEDEC Solid State Technology Association, USA, Jul. 2009.

(Continued)

*Primary Examiner*—Pho M Luu
(74) *Attorney, Agent, or Firm*—Fish & Richardson P.C.

(57) ABSTRACT

A method for operating a memory (20) includes storing analog values in an array of analog memory cells (22), so that each of the analog memory cells holds an analog value corresponding to at least first and second respective bits. A first indication of the analog value stored in a given analog memory cell is obtained using a first set of sampling parameters. A second indication of the analog value stored in the given analog memory cell is obtained using a second set of sampling parameters, which is dependent upon the first indication. The first and second respective bits are read out from the given analog memory cell responsively to the first and second indications.

46 Claims, 6 Drawing Sheets

U.S. PATENT DOCUMENTS

| | | |
|---|---|---|
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,172,338 A | 12/1992 | Mehrotta et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,388,064 A | 2/1995 | Khan |
| 5,416,782 A | 5/1995 | Wells et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,541,886 A | 7/1996 | Hasbun |
| 5,600,677 A | 2/1997 | Citta et al. |
| 5,657,332 A | 8/1997 | Auclair et al. |
| 5,675,540 A | 10/1997 | Roohparvar |
| 5,696,717 A | 12/1997 | Koh |
| 5,726,649 A | 3/1998 | Tamaru et al. |
| 5,742,752 A | 4/1998 | De Koning |
| 5,751,637 A | 5/1998 | Chen et al. |
| 5,761,402 A | 6/1998 | Kaneda et al. |
| 5,801,985 A | 9/1998 | Roohparvar et al. |
| 5,838,832 A | 11/1998 | Barnsley |
| 5,860,106 A | 1/1999 | Domen et al. |
| 5,867,429 A | 2/1999 | Chen et al. |
| 5,877,986 A | 3/1999 | Harari et al. |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,942,004 A | 8/1999 | Cappelletti |
| 5,991,517 A | 11/1999 | Harari et al. |
| 6,009,014 A | 12/1999 | Hollmer et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,166,962 A | 12/2000 | Chen et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,275,419 B1 | 8/2001 | Guterman et al. |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,396,742 B1 | 5/2002 | Korsh et al. |
| 6,397,364 B1 | 5/2002 | Barkan |
| 6,405,323 B1 | 6/2002 | Lin et al. |
| 6,418,060 B1 | 7/2002 | Yong et al. |
| 6,442,585 B1 | 8/2002 | Dean et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,558,967 B1 | 3/2003 | Wong |
| 6,560,152 B1 | 5/2003 | Cernea |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,643,169 B2 | 11/2003 | Rudelic et al. |
| 6,678,192 B2 | 1/2004 | Gongwer et al. |
| 6,687,155 B2 | 2/2004 | Nagasue |
| 6,707,748 B2 | 3/2004 | Lin et al. |
| 6,708,257 B2 | 3/2004 | Bao |
| 6,717,847 B2 | 4/2004 | Chen |
| 6,731,557 B2 | 5/2004 | Beretta |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,807,095 B2 | 10/2004 | Chen et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,894,926 B2 | 5/2005 | Guterman et al. |
| 6,907,497 B2 | 6/2005 | Hosono et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 7,002,843 B2 | 2/2006 | Guterman et al. |
| 7,012,835 B2 | 3/2006 | Gonzales et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,054,193 B1 | 5/2006 | Wong |
| 7,057,958 B2 | 6/2006 | So et al. |
| 7,065,147 B2 | 6/2006 | Ophir et al. |
| 7,068,539 B2 | 6/2006 | Guterman et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzales et al. |
| 7,177,199 B2 | 2/2007 | Chen et al. |
| 7,177,200 B2 | 2/2007 | Ronen et al. |
| 7,187,195 B2 | 3/2007 | Kim |
| 7,187,592 B2 | 3/2007 | Guterman et al. |
| 7,193,898 B2 | 3/2007 | Cernea |
| 7,193,921 B2 | 3/2007 | Choi et al. |
| 7,196,928 B2 | 3/2007 | Chen |
| 7,197,594 B2 | 3/2007 | Raz et al. |

| Patent No. | Date | Inventor | | Patent No. | Date | Inventor |
|---|---|---|---|---|---|---|
| 7,200,062 B2 | 4/2007 | Kinsely et al. | | 2006/0028877 A1 | 2/2006 | Meir |
| 7,221,592 B2 | 5/2007 | Nazarian | | 2006/0101193 A1 | 5/2006 | Murin |
| 7,224,613 B2 | 5/2007 | Chen et al. | | 2006/0107136 A1 | 5/2006 | Gongwer et al. |
| 7,231,474 B1 | 6/2007 | Helms et al. | | 2006/0129750 A1 | 6/2006 | Lee et al. |
| 7,231,562 B2 | 6/2007 | Ohlhoff et al. | | 2006/0133141 A1 | 6/2006 | Gorobets |
| 7,243,275 B2 | 7/2007 | Gongwer et al. | | 2006/0156189 A1 | 7/2006 | Tomlin |
| 7,254,690 B2 | 8/2007 | Rao | | 2006/0179334 A1 | 8/2006 | Brittain et al. |
| 7,257,027 B2 | 8/2007 | Park | | 2006/0203546 A1 | 9/2006 | Lasser |
| 7,259,987 B2 | 8/2007 | Chen et al. | | 2006/0218359 A1 | 9/2006 | Sanders et al. |
| 7,266,026 B2 | 9/2007 | Gongwer et al. | | 2006/0221705 A1 | 10/2006 | Hemink et al. |
| 7,274,611 B2 | 9/2007 | Roohparvar | | 2006/0239077 A1 | 10/2006 | Park et al. |
| 7,277,355 B2 | 10/2007 | Tanzawa | | 2006/0256620 A1 | 11/2006 | Nguyen et al. |
| 7,280,398 B1 | 10/2007 | Lee et al. | | 2006/0256626 A1 | 11/2006 | Werner et al. |
| 7,289,344 B2 | 10/2007 | Chen | | 2006/0256891 A1 | 11/2006 | Yuan et al. |
| 7,301,807 B2 | 11/2007 | Khalid et al. | | 2006/0271748 A1 | 11/2006 | Jain et al. |
| 7,308,525 B2 | 12/2007 | Lasser et al. | | 2006/0285392 A1 | 12/2006 | Incarnati et al. |
| 7,310,255 B2 | 12/2007 | Chan | | 2006/0285396 A1 | 12/2006 | Ha |
| 7,310,272 B1 | 12/2007 | Mokhlesi et al. | | 2007/0006013 A1 | 1/2007 | Moshayedi et al. |
| 7,321,509 B2 | 1/2008 | Chen et al. | | 2007/0019481 A1 | 1/2007 | Park |
| 7,342,831 B2 | 3/2008 | Mokhlesi et al. | | 2007/0033581 A1 | 2/2007 | Tomlin et al. |
| 7,345,928 B2 | 3/2008 | Li | | 2007/0047314 A1 | 3/2007 | Goda et al. |
| 7,349,263 B2 | 3/2008 | Kim et al. | | 2007/0047326 A1 | 3/2007 | Nguyen et al. |
| 7,356,755 B2 | 4/2008 | Fackenthal | | 2007/0050536 A1 | 3/2007 | Kolokowsky |
| 7,363,420 B2 | 4/2008 | Lin et al. | | 2007/0058446 A1 | 3/2007 | Hwang et al. |
| 7,397,697 B2 | 7/2008 | So et al. | | 2007/0061502 A1 | 3/2007 | Lasser et al. |
| 7,408,804 B2 | 8/2008 | Hemink et al. | | 2007/0067667 A1 | 3/2007 | Ikeuchi et al. |
| 7,409,473 B2 | 8/2008 | Conley et al. | | 2007/0074093 A1 | 3/2007 | Lasser |
| 7,420,847 B2 | 9/2008 | Li | | 2007/0086239 A1 | 4/2007 | Litsyn et al. |
| 7,433,231 B2 | 10/2008 | Aritome | | 2007/0086260 A1 | 4/2007 | Sinclair |
| 7,437,498 B2 | 10/2008 | Ronen | | 2007/0089034 A1 | 4/2007 | Litsyn et al. |
| 7,441,067 B2 | 10/2008 | Gorobetz et al. | | 2007/0091677 A1 | 4/2007 | Lasser et al. |
| 7,453,737 B2 | 11/2008 | Ha | | 2007/0091694 A1 | 4/2007 | Lee et al. |
| 7,468,911 B2 | 12/2008 | Lutze et al. | | 2007/0103978 A1 | 5/2007 | Conley et al. |
| 7,471,581 B2 | 12/2008 | Tran et al. | | 2007/0103986 A1 | 5/2007 | Chen |
| 7,508,710 B2 | 3/2009 | Mokhlesi | | 2007/0109845 A1 | 5/2007 | Chen |
| 7,539,062 B2 | 5/2009 | Doyle | | 2007/0109849 A1 | 5/2007 | Chen |
| 7,570,520 B2 | 8/2009 | Kamei et al. | | 2007/0118713 A1 | 5/2007 | Guterman et al. |
| 7,593,259 B2 | 9/2009 | Kim et al. | | 2007/0143378 A1 | 6/2007 | Gorobets |
| 7,633,802 B2 | 12/2009 | Mokhlesi | | 2007/0143531 A1 | 6/2007 | Atri |
| 7,660,158 B2 | 2/2010 | Aritome | | 2007/0159889 A1 | 7/2007 | Kang et al. |
| 7,742,351 B2 * | 6/2010 | Inoue et al. ........ 365/203 | | 2007/0159892 A1 | 7/2007 | Kang et al. |
| 2001/0002172 A1 | 5/2001 | Tanaka et al. | | 2007/0159907 A1 | 7/2007 | Kwak |
| 2001/0006479 A1 | 5/2001 | Ikehashi et al. | | 2007/0168837 A1 | 7/2007 | Murin |
| 2002/0038440 A1 | 3/2002 | Barkan | | 2007/0171714 A1 | 7/2007 | Wu et al. |
| 2002/0118574 A1 | 8/2002 | Gongwer et al. | | 2007/0183210 A1 | 8/2007 | Choi et al. |
| 2002/0174295 A1 | 11/2002 | Ulrich et al. | | 2007/0189073 A1 | 8/2007 | Aritome |
| 2002/0196510 A1 | 12/2002 | Hietala et al. | | 2007/0206426 A1 | 9/2007 | Mokhlesi |
| 2003/0002348 A1 | 1/2003 | Chen et al. | | 2007/0208904 A1 | 9/2007 | Hsieh et al. |
| 2003/0103400 A1 | 5/2003 | Van Tran | | 2007/0226599 A1 | 9/2007 | Motwani |
| 2003/0161183 A1 | 8/2003 | Hieu Van Tran | | 2007/0236990 A1 | 10/2007 | Aritome |
| 2003/0189856 A1 | 10/2003 | Cho et al. | | 2007/0253249 A1 | 11/2007 | Kang et al. |
| 2004/0057265 A1 | 3/2004 | Mirabel et al. | | 2007/0256620 A1 | 11/2007 | Viggiano et al. |
| 2004/0057285 A1 | 3/2004 | Cernea et al. | | 2007/0266232 A1 | 11/2007 | Rodgers et al. |
| 2004/0083333 A1 | 4/2004 | Chang et al. | | 2007/0271424 A1 | 11/2007 | Lee et al. |
| 2004/0083334 A1 | 4/2004 | Chang et al. | | 2007/0280000 A1 | 12/2007 | Fujiu et al. |
| 2004/0105311 A1 | 6/2004 | Cernea et al. | | 2008/0010395 A1 | 1/2008 | Mylly et al. |
| 2004/0114437 A1 | 6/2004 | Li | | 2008/0025121 A1 | 1/2008 | Tanzawa |
| 2004/0160842 A1 | 8/2004 | Fukiage | | 2008/0043535 A1 | 2/2008 | Roohparvar |
| 2005/0007802 A1 | 1/2005 | Gerpheide | | 2008/0049504 A1 | 2/2008 | Kasahara et al. |
| 2005/0013165 A1 | 1/2005 | Ban | | 2008/0049506 A1 | 2/2008 | Guterman |
| 2005/0024941 A1 | 2/2005 | Lasser et al. | | 2008/0055993 A1 | 3/2008 | Lee |
| 2005/0024978 A1 | 2/2005 | Ronen | | 2008/0080243 A1 | 4/2008 | Edahiro et al. |
| 2005/0086574 A1 | 4/2005 | Fackenthal | | 2008/0082730 A1 | 4/2008 | Kim et al. |
| 2005/0121436 A1 | 6/2005 | Kamitani et al. | | 2008/0104309 A1 | 5/2008 | Cheon et al. |
| 2005/0162913 A1 | 7/2005 | Chen | | 2008/0109590 A1 | 5/2008 | Jung et al. |
| 2005/0169051 A1 | 8/2005 | Khalid et al. | | 2008/0115017 A1 | 5/2008 | Jacobson |
| 2005/0189649 A1 | 9/2005 | Maruyama et al. | | 2008/0123420 A1 | 5/2008 | Brandman et al. |
| 2005/0213393 A1 | 9/2005 | Lasser | | 2008/0126686 A1 | 5/2008 | Sokolov et al. |
| 2005/0224853 A1 | 10/2005 | Ohkawa | | 2008/0130341 A1 | 6/2008 | Shalvi et al. |
| 2005/0240745 A1 | 10/2005 | Iyer et al. | | 2008/0148115 A1 | 6/2008 | Sokolov et al. |
| 2005/0243626 A1 | 11/2005 | Ronen | | 2008/0158958 A1 | 7/2008 | Sokolov et al. |
| 2006/0004952 A1 | 1/2006 | Lasser | | 2008/0181001 A1 | 7/2008 | Shalvi |
| 2006/0028875 A1 | 2/2006 | Avraham et al. | | 2008/0198650 A1 | 8/2008 | Shalvi et al. |

| | | | |
|---|---|---|---|
| 2008/0209116 A1 | 8/2008 | Caulkins | |
| 2008/0209304 A1 | 8/2008 | Winarski et al. | |
| 2008/0215798 A1 | 9/2008 | Sharon et al. | |
| 2008/0219050 A1 | 9/2008 | Shalvi et al. | |
| 2008/0239812 A1 | 10/2008 | Abiko et al. | |
| 2008/0263262 A1 | 10/2008 | Sokolov et al. | |
| 2008/0282106 A1 | 11/2008 | Shalvi et al. | |
| 2009/0024905 A1 | 1/2009 | Shalvi et al. | |
| 2009/0043831 A1 | 2/2009 | Antonopoulos et al. | |
| 2009/0043951 A1 | 2/2009 | Shalvi et al. | |
| 2009/0049234 A1 | 2/2009 | Oh et al. | |
| 2009/0086542 A1* | 4/2009 | Lee et al. | 365/185.17 |
| 2009/0089484 A1 | 4/2009 | Chu | |
| 2009/0091979 A1 | 4/2009 | Shalvi | |
| 2009/0094930 A1 | 4/2009 | Schwoerer | |
| 2009/0106485 A1 | 4/2009 | Anholt | |
| 2009/0132755 A1 | 5/2009 | Radke | |
| 2009/0144600 A1 | 6/2009 | Perlmutter et al. | |
| 2009/0150894 A1 | 6/2009 | Huang et al. | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0172257 A1 | 7/2009 | Prins et al. | |
| 2009/0172261 A1 | 7/2009 | Prins et al. | |
| 2009/0204824 A1 | 8/2009 | Lin et al. | |
| 2009/0204872 A1 | 8/2009 | Yu et al. | |
| 2009/0225595 A1 | 9/2009 | Kim | |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann | |
| 2010/0017650 A1 | 1/2010 | Chin et al. | |
| 2010/0057976 A1 | 3/2010 | Lasser | |
| 2010/0061151 A1 | 3/2010 | Miwa et al. | |
| 2010/0142277 A1* | 6/2010 | Yang et al. | 365/185.12 |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009027103 A2 | 6/2009 |
| WO | 2009072100 A2 | 6/2009 |
| WO | 2009072101 A2 | 6/2009 |
| WO | 2009072102 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

JEDEC, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Takeuchi et al., "A Multipage Cell Architecture for High-Speed Programming Multilevel NAND Flash Memories," IEEE Journal of Solid-State Circuits, (33:8), Aug. 1998, pp. 1228-1238.
U.S. Appl. No. 60/863,506, filed Oct. 30, 2006.
U.S. Appl. No. 60/867,204, filed Nov. 27, 2006.
U.S. Appl. No. 60/863,810, filed Nov. 1, 2006.
U.S. Appl. No. 60/917,653, filed May 12, 2007.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
U.S. Appl. No. 11/949,135 Official Action dated Oct. 2, 2009.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May, 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

Sommer, N., U.S. Appl. No. 12/364,531 "Parameter Estimation Based on Error Correction Code Parity Check Equations" filed Feb. 3, 2009.

Perlmutter et al., U.S. Appl. No. 12/388,528 "Programming of Analog Memory Cells Using a Single Programming Pulse per State Transition" filed Feb. 19, 2009.

Perlmutter et al., U.S. Appl. No. 12/390,522 "Programming Analog Memory Cells for Reduced Variance After Retention" filed Feb. 23, 2009.

Perlmutter et al., U.S. Appl. No. 12/405,275 "Memory Device with Multiple-Accuracy Read Commands" filed Mar. 17, 2009.

Perlmutter et al., U.S. Appl. No. 12/397,368 "Efficient Readout from Analog Memory Cells Using Data Compression" filed Mar. 4, 2009.

Sommer, N., U.S. Appl. No. 12/171,797 "Memory Device with Non-Uniform Programming Levels" filed Jul. 11, 2008.

Shalvi et al., U.S. Appl. No. 12/251,471 "Compensation for Voltage Drifts in Analog Memory Cells" filed Oct. 15, 2008.

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action dated May 20, 2010.

Shalvi et al., U.S. Appl. No. 12/822,207 "Adaptive Over-Provisioning in Memory Systems" filed on Jun. 24, 2010.

US 7,161,836, 01/2007, Wan et al. (withdrawn)

\* cited by examiner

MEMORY CELL READOUT USING SUCCESSIVE APPROXIMATION

CROSS-REFERENCE TO RELATED APPLICATION

This application is the U.S. national phase of PCT Application No. PCT/IL2007/001316, filed on Oct. 30, 2007, which claims benefit of U.S. Provisional Patent Application 60/863,506, filed Oct. 30, 2006, which is incorporated herein by reference.

FIELD OF THE INVENTION

The present invention relates generally to memory devices, and particularly to methods and systems for reading data from memory cells.

BACKGROUND OF THE INVENTION

Several types of memory devices, such as Flash memories, use arrays of analog memory cells for storing data. Each analog memory cell stores a quantity of an analog value, such as an electrical charge or voltage, which represents the information stored in the cell. In Flash memories, for example, each analog memory cell holds a certain amount of electrical charge. The range of possible analog values is typically divided into regions, each region corresponding to one or more data bit values. Data are written to an analog memory cell by writing a nominal analog value that corresponds to the desired bit or bits. The possible bit values that can be stored in an analog memory cell are also referred to as the memory states of the cell.

Some memory devices, commonly referred to as Single-Level Cell (SLC) devices, store a single bit of information in each memory, cell, i.e., each memory cell can be programmed to assume one of two possible memory states. Higher-density devices, often referred to as Multi-Level Cell (MLC) devices, can be programmed to assume more than two possible memory states and thus store two or more bits per memory cell. Various methods are known in the art for reading out the multi-bit data that are stored in such cells.

For example, U.S. Pat. No. 6,317,364, whose disclosure is incorporated herein by reference, describes a multi-state memory, which is said to use a flexible, self-consistent and self-adapting mode of detection, covering a wide dynamic range. In one embodiment, cells of the memory are read using a control gate in a binary search. The readout uses a sensing circuit consisting of a sense amplifier comparator, with one input lead that receives an input signal from the memory cell and another that receives a reference signal. The output of the comparator is used to update a Control Gate Register Element. The value stored in this element is used to provide the next control gate read voltage.

Takeuchi et al. suggest another cell readout technique in "A Multipage Cell Architecture for High-Speed Programming Multilevel NAND Flash Memories," *IEEE Journal of Solid-State Circuits* 33:8 (1998), pages 1228-1238, which is incorporated herein by reference. The authors describe a cell that contains two "pages," meaning that the two bits in the cell are programmed in different operations. The cell is read using a four-level column latch circuit, which is shared by two bit lines. The read operation is composed of three phases, during which the word line control gate voltage is set to three different bias values. As a result of this operation, the first and second, page data in the cell are read out on the cell bit line and latched in first and second latches, respectively, of the latch circuit.

SUMMARY OF THE INVENTION

An embodiment of the present invention provides a method for operating a memory, including:

storing analog values in an array of analog memory cells, so that each of the analog memory cells holds an analog value corresponding to at least first and second respective bits, the array including word lines and bit lines connected to the analog memory cells;

obtaining a first indication of the analog value stored in a given analog memory cell by precharging a bit line connected to the given analog memory cell to a first precharge voltage, and then sampling a first current on the bit line;

obtaining a second indication of the analog value stored in the given analog memory cell by precharging the bit line connected to the given analog memory cell to a second precharge voltage, which is dependent upon the first indication, and then sampling a second current on the bit line; and reading out the first and second respective bits from the given analog memory cell responsively to the first and second indications.

Typically, the first indication is indicative of the first respective bit stored in the given analog memory cell, and the second indication is indicative of the second respective bit stored in the given analog memory cell. In disclosed embodiments, reading out the first and second respective bits includes reading out the first respective bit prior to sampling the second current. In one embodiment, the first respective bit belongs to a first page of data, and the second respective bit belongs to a second page of data, and the method includes using the first respective bit read out from the given analog memory cell to decode the first page of the data while obtaining the second indication.

In some embodiments, sampling the first current includes comparing the first current to a predetermined threshold. Typically, precharging the bit line connected to the given analog memory cell to the second precharge voltage includes setting the second precharge voltage to a first level when the first current is below the predetermined threshold, and setting the second precharge voltage to a second level, greater than the first level, when the first current is above the predetermined threshold. In one embodiment, the predetermined threshold is a first threshold, and sampling the second current includes comparing the second current to a second threshold, which is different from the first threshold.

In a disclosed embodiment, obtaining a third indication of the analog value stored in the given analog memory cell by precharging the bit line connected to the given analog memory cell to a third precharge voltage, which is dependent upon at least the second indication, and then sampling a third current on the bit line, and reading out at least a third bit from the given analog memory cell responsively to the third indication.

Additionally or alternatively, the memory includes decoding data including at least one of the first and second respective bits that have been read out from the given analog memory cell, and upon occurrence of a failure in decoding the data, obtaining a third indication of the analog value stored in the given analog memory cell using a set of sampling parameters that is dependent upon at least the second indication, and then decoding the data using the third indication together with at least one of the first and second indications.

Typically, sampling the first current includes applying a predetermined control voltage to a word line connected to the given analog memory cell in order to cause the given analog memory cell to conduct the first current; and sampling the second current includes applying the same predetermined control voltage to the word line connected to the given analog memory cell in order to cause the given analog memory cell to conduct the second current.

Optionally, sampling the first current includes sampling the first current on the bit line after a first delay, and sampling the second current includes sampling the second current on the bit line after a second delay, which is dependent upon the first indication.

There is also provided, in accordance with an embodiment of the present invention, a method for operating a memory, including:

storing analog values in an array of analog memory cells, so that each of the analog memory cells holds an analog value corresponding to at least first and second respective bits, the array including word lines and bit lines connected to the analog memory cells;

obtaining a first indication of the analog value stored in a given analog memory cell by precharging a bit line connected to the given analog memory cell, and then sampling a first current on the bit line after a first delay;

obtaining a second indication of the analog value stored in the given analog memory cell by precharging the bit line connected to the given analog memory cell, and then sampling a second current on the bit line after a second delay, which is dependent upon the first indication; and reading out the first and second respective bits from the given analog memory cell responsively to the first and second indications.

In a disclosed embodiment, sampling the first current includes comparing the first current to a predetermined threshold, and sampling the second current includes setting the second delay to a first delay time when the first current is below the predetermined threshold, and setting the second delay to a second delay time, greater than the first delay time, when the first current is above the predetermined threshold.

There is additionally provided, in accordance with an embodiment of the present invention, a method for operating a memory, including:

storing analog values in a group of analog memory cells, so that each of the analog memory cells holds an analog value corresponding to at least first and second respective bits belonging respectively to first and second pages of data;

obtaining a first indication of the analog value stored in a given analog memory cell by sampling the given analog memory cell using a first set of sampling parameters, wherein the first indication is indicative of the first respective bit stored in the given analog memory cell;

obtaining a second indication of the analog value stored in the given analog memory cell by sampling the given analog memory cell using a second set of sampling parameters, which is dependent upon the first indication, wherein the second indication is indicative of the second respective bit stored in the given analog memory cell; and reading out the first bit from the given analog memory cell responsively to the first indication, and decoding the first page of the data using the first bit while obtaining the second indication.

In one embodiment, the method includes, upon occurrence of a failure in decoding one of the pages of the data, obtaining a third indication of the analog value stored in the given analog memory cell using a third set of sampling parameters that is dependent upon at least the second indication, and then decoding the one of the pages using the third indication together with at least one of the first and second indications.

There is further provided, in accordance with an embodiment of the present invention, memory apparatus, including:

an array of analog memory cells, which are configured to store analog values so that each of the analog memory cells holds an analog value corresponding to at least first and second respective bits, the array including word lines and bit lines connected to the analog memory cells; and readout circuitry, which is connected to the word lines and the bit lines and is configured to obtain first and second indications of the analog value stored in the given memory cell by precharging a bit line connected to the given analog memory cell to a first precharge voltage and then sampling a first current on the bit line so as to obtain the first indication, and precharging the bit line connected to the given analog memory cell to a second precharge voltage, which is dependent upon the first indication, and then sampling a second current on the bit line so as to obtain the second indication, and which is configured to read out the first and second respective bits from the given analog memory cell responsively to the first and second indications.

There is moreover provided, in accordance with an embodiment of the present invention, memory apparatus, including:

an array of analog memory cells, which are configured to store analog values so that each of the analog memory cells holds an analog value corresponding to at least first and second respective bits, the array including word lines and bit lines connected to the analog memory cells; and readout circuitry, which is connected to the word lines and the bit lines and is configured to obtain first and second indications of the analog value stored in the given memory cell by precharging a bit line connected to the given analog memory cell and then sampling a first current on the bit line after a first delay so as to obtain the first indication, and precharging the bit line connected to the given analog memory cell and then sampling a second current on the bit line after a second delay, which is dependent upon the first indication, so as to obtain the second indication, and which is configured to read out the first and second respective bits from the given analog memory cell responsively to the first and second indications.

There is furthermore provided, in accordance with an embodiment of the present invention, memory apparatus, including:

a group of analog memory cells, which are configured to store analog values so that each of the analog memory cells holds an analog value corresponding to at least first and second respective bits belonging respectively to first and second pages of data;

readout circuitry, which is coupled to the analog memory cells and is configured to obtain a first indication of the analog value stored in a given analog memory cell by sampling the given analog memory cell using a first set of sampling parameters, wherein the first indication is indicative of the first respective bit stored in the given analog memory cell, and to obtain a second indication of the analog value stored in the given analog memory cell by sampling the given analog memory cell using a second set of sampling parameters, which is dependent upon the first indication, wherein the second indication is indicative of the second respective bit stored in the given analog memory cell; and a decoder, which is coupled to receive the first bit from the readout circuitry and to decode the first page of the data using the first bit while the readout circuitry is obtaining the second indication.

The present invention will be more fully understood from the following detailed description of the embodiments thereof, taken together with the drawings in which:

DETAILED DESCRIPTION OF EMBODIMENTS

Overview

Figure 1:
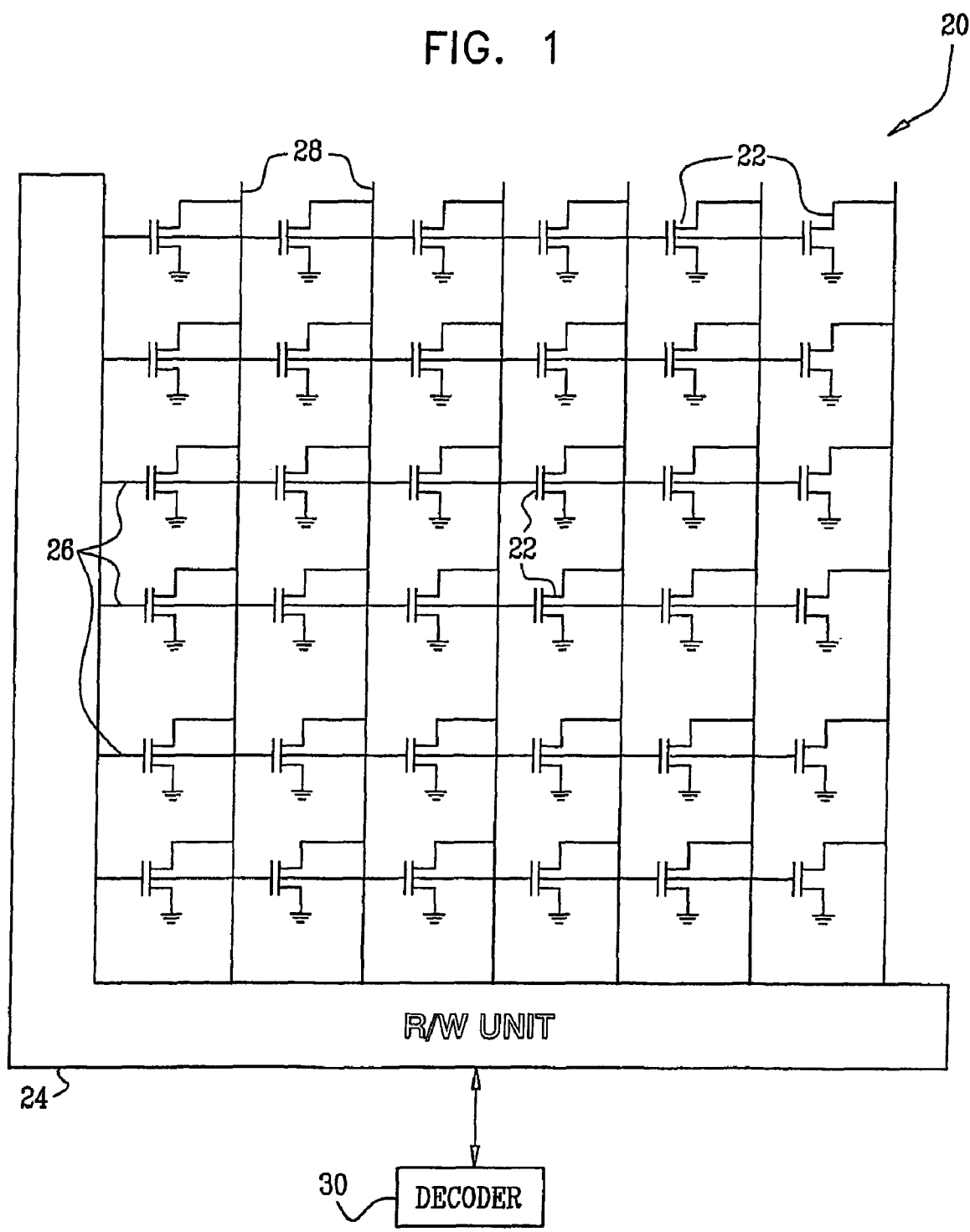
FIG. 1 is a block diagram that schematically illustrates a memory cell array, in accordance with an embodiment of the present invention.

The embodiments of the present invention that are described hereinbelow provide improved methods and apparatus for reading data from analog memory cells, such as MLC Flash memory cells. These embodiments typically use a sequence of steps of successive approximation in order to determine the analog value stored in a given cell and thus read out the corresponding bits. The first step uses a certain set of sampling parameters to determine whether the analog value is in the upper or lower range of possible values. In the next step, one or more of the sampling parameters are modified, depending upon the results of the first step, in order to determine whether the analog value is in the upper or lower part of whichever range was identified in the first step. This process may be repeated until the actual analog value stored in the cell has been determined, and the bits in the cell have thus been read out.

In order to read the analog value stored in a given analog memory cell, the bit line that is connected to the cell is typically precharged to a certain precharge voltage, and the current that subsequently flows through the bit line is sampled. This sampled current is compared to a predetermined threshold in order to determine whether the analog value is in the upper or lower part of the range. A certain control voltage is applied to the word line that is connected to the given analog memory cell in order to cause the given analog memory cell to conduct the current. The methods of controlling and varying the sampling parameters that are described hereinbelow, however, are not dependent on varying this control voltage (which is commonly referred to in Flash memories as the control gate voltage), and a constant control gate voltage may be used in all of the sampling steps.

In some of the disclosed embodiments, the precharge voltage that is applied to the bit line in the second and subsequent steps of the readout process depends upon the indication of the analog value that was obtained in the previous step. For example, if the first step of the process indicated that the analog value is in the upper part of the range, the precharge in the second step may then be set to a higher voltage than if the analog value had been indicated to be in the lower part of the range.

The current flowing through the bit line decays over time following application of the precharge and control gate voltage. (As a result, the choice of the threshold depends on the sampling delay, and vice versa.) The rate of decay of the bit line current depends on the analog value that is stored in the cell. Therefore, in some embodiments of the present invention, the sampling delay that is used in the second and subsequent steps of the readout process depends upon the indication of the analog value that was obtained in the previous step.

The techniques noted above for control of precharge and of sampling delay may be used individually, or they may alternatively be combined, with variation applied to both the precharge and the sampling delay depending on results of the previous step. Alternatively or additionally, other sampling parameters, such as the comparison threshold, may be varied from step to step along with the precharge and/or sampling delay.

Typically, the analog value that is stored in each cell corresponds to a set of two or more bits of data that are stored in the cell, and the indication of the analog value that is obtained in each of the successive approximation steps may be indicative of a different bit in the set. The data may be stored in the array so that each of the bits in a given cell belongs to a different page of data. In this case, each bit may be read out of a given cell prior to the sampling step that will yield the next bit, and may be used in decoding the page of data to which the bit belongs while the successive approximation of the succeeding bit or bits is still in progress.

Memory Array Structure and System Description

FIG. 1 is a block diagram that schematically illustrates a MLC memory cell array 20, in accordance with an embodiment of the present invention. Although FIG. 1 refers to Flash memory cells that are connected in a particular array configuration, the principles of the present invention are applicable to other types of memory cells and other array configurations, as well.

Memory cells 22 of array 20 are arranged in a grid having multiple rows and columns. Each cell 22 comprises a floating gate Metal-Oxide Semiconductor (MOS) transistor. A certain amount of electrical charge (electrons or holes) can be stored in a particular cell by applying appropriate voltage levels to the transistor gate, source and drain. The amount of charge corresponds to the analog value that is stored in the cell, which is indicative of the data bits that are stored in the cell. In the exemplary configuration of FIG. 1, the gates of the transistors in each row are connected by word lines 26, while the sources of the transistors in each column are connected by bit lines 28. In some embodiments, such as in some NOR cell devices, the sources are connected to the bit lines directly. In alternative embodiments, such as in some NAND cell devices, the bit lines are connected to strings of floating-gate cells.

The source-drain resistance of each cell 22 depends on the amount of charge stored in the cell. This resistance may be estimated by applying a control voltage to the gate of the transistor and measuring the current flowing between the source and drain. For this purpose, a read/write (R/W) unit 24 precharges bit line 28 to which the cell is connected and then applies the control voltage to word line 26 of the cell. Unit 24 then samples the current flowing through the bit line in order to determine the analog value that is stored in the cell in a process of successive approximation, as explained in detail hereinbelow.

The memory cell array is typically divided into multiple pages, i.e., groups of memory cells that are programmed and read simultaneously. In some embodiments, each page comprises an entire row of the array. In other embodiments, each row (word line) can be divided into two or more pages. Typically, unit 24 reads a group of cells, such as an entire row, simultaneously. Alternatively, unit 24 may implement any other suitable read/write architecture. For the sake of convenience and clarity, however, the description that follows will relate generally to reading of individual cells, on the understanding that the techniques and circuits that are described hereinbelow may be extended in a straightforward manner to parallel readout of multiple cells.

Data stored in array 20 are read out by R/W unit 24 to a decoder 30. The decoder may be located either on the same integrated circuit chip as array 20 or in a separate processing and control device. The decoder may implement, inter alia, memory signal processing functions of the types described, for example, in PCT Patent Application PCT/IL2007/000 580$_{[DK1]}$, filed May 10, 2007, which is assigned to the assignee of the present patent application and whose disclosure is incorporated herein by reference. These functions may include distortion estimation and application of error correcting codes to the values read out of array 20.

Figure 2:
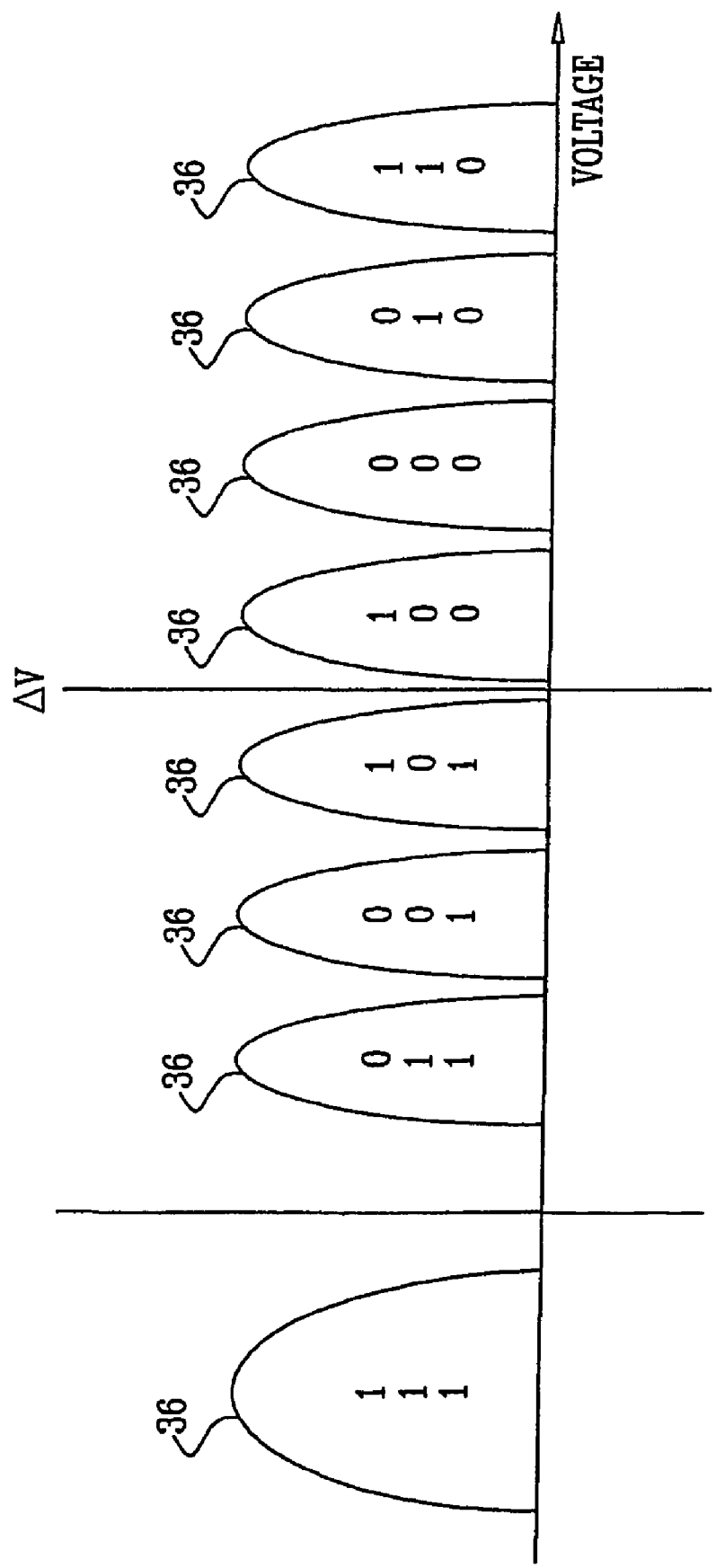
FIG. 2 is a diagram that schematically illustrates memory states of the cells in the array of FIG. 1, in accordance with an embodiment of the present invention.

FIG. 2 is a diagram that schematically illustrates memory states 36 of cells 22 in array 20, in accordance with an embodiment of the present invention. In this example, it is assumed that array 20 stores three bits per cell, but the principles of the present invention may equally be applied to memories that store any other practical number of bits per cell. Each state 36 corresponds to a certain analog value, in the form of charge (or equivalently voltage levels) that is stored in the cell in question. In practice, the actual stored analog values in cells 22 that correspond to a given state 36 spread statistically over a range of values, as is illustrated by the curves corresponding to the states in FIG. 2. Read/write unit 24 reads the state of a given cell by determining whether the charge or voltage stored in the cell is above or below each of a set of successive thresholds, as described further hereinbelow.

Each state 36 represents a different set of bit values, which are marked as three-digit binary numbers on the respective states in FIG. 2. The top bit in each state will be referred to hereinbelow, for the sake of convenience, as the most significant bit (MSB), and bottom bit will be referred to as the least significant bit (LSB), with the middle bit in between. In many MLC memory devices, the MSB, middle bit, and LSB all belong to different pages of data, which are written in succession to a given row of cells. By convention, the LSB is written first, followed by the middle bit, and then finally by the MSB, and erased cells have the default value "111".

Various coding schemes may be used to assign the eight possible sets of bit values to states 36. In the scheme shown in FIG. 2, the four lower-voltage states have LSB=1, while the four upper-voltage states have LSB=0. Thus, the LSB determines whether the cell in question will have an analog value in one of two ranges, either above or below a central threshold ΔV. The middle bit then determines whether the cell will have an analog value in the upper or lower sub-range of the range associated with the LSB. In other words, the combination of the LSB and middle bit defines four sub-ranges. Finally, the MSB determines whether the analog value of the cell will be in the upper state or the lower state of the two states contained in the sub-range defined by the middle bit. This scheme permits the LSB, middle bit, and MSB to be read out, in that order, by a process of successive approximation of the cell voltage that is explained hereinbelow.

Readout Circuit and Method for Successive Approximation

Figure 3:
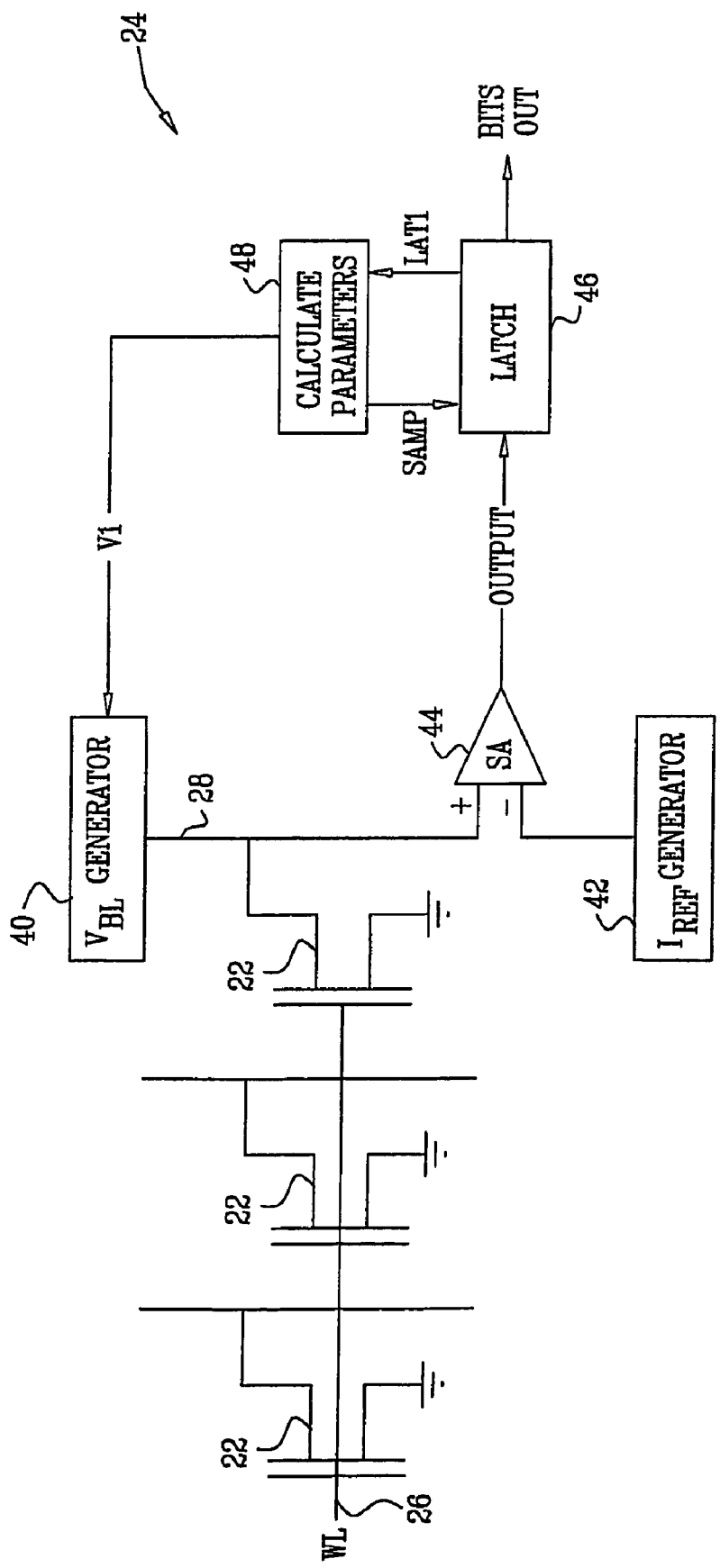
FIG. 3 is a block diagram that schematically shows details of a readout circuit for reading data from memory cells, in accordance with an embodiment of the present invention.

FIG. 3 is a block diagram that schematically shows details of a readout circuit that may be used in R/W unit 24 for reading data from memory cells 22, in accordance with an embodiment of the present invention. Typically, the readout circuit (along with other components of the R/W unit) is fabricated on the same integrated circuit chip as the array of memory cells. Alternatively, certain elements of the readout circuit may be located on a separate memory controller chip. Although FIG. 3 shows the readout circuit as being connected only to a single memory cell, in practice the readout circuit typically serves an entire column of cells that are connected to a common bit line 28 (wherein word lines 26 are controlled to select the cell that is to be read out at any given time). Alternatively or additionally, the readout circuit may be time-multiplexed among multiple columns of cells in order to save space on the chip.

To read out the analog value stored in cell 22, a bit line voltage ($V_{BL}$) generator 40 precharges bit line 28 to a certain precharge voltage V1, which may be varied by a controller 48. For example, generator 40 may comprise a current generator, which applies a constant current for a certain period of time. The magnitude of the current and/or the length of the period of time is chosen by the controller in order to give the desired precharge voltage. R/W unit 24 applies a control gate voltage to word line 26, which causes a current to flow (and gradually decay) in bit line 28. A sense amplifier 44 compares the bit line current to a constant reference current ($I_{REF}$) provided by a current generator 42. (Alternatively, the sense amplifier may compare the bit line voltage to a reference voltage.) The output of amplifier 44 is recorded by a latch 46 at a sampling time that is specified by controller 48. If the bit line current is greater than $I_{REF}$ at the specified sampling time, for example, the latch records a logical "0" and otherwise records a logical "1".

Figure 4:
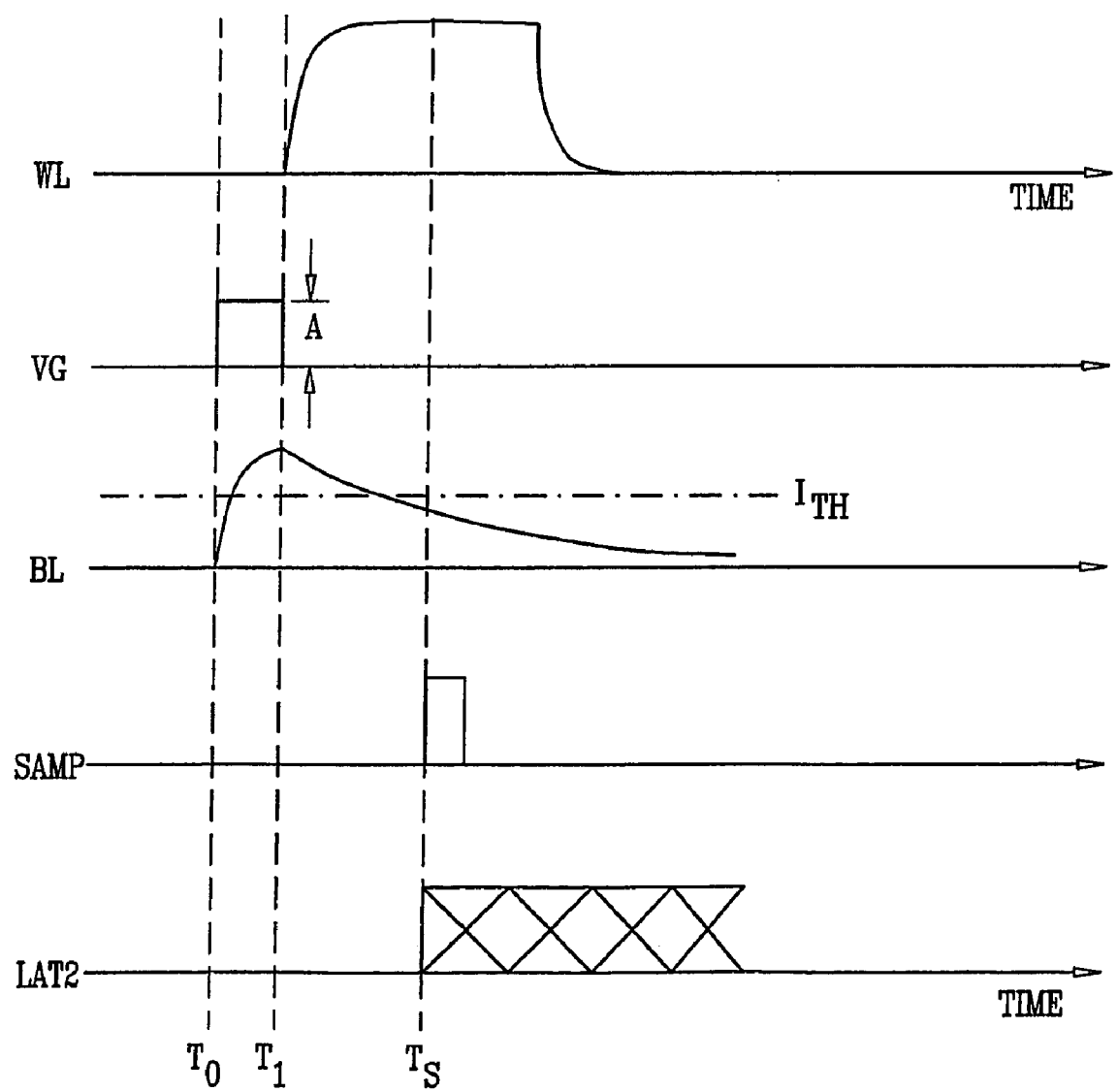
FIG. 4 is a timing diagram that schematically shows signals involved in reading out bits stored in a memory cell, in accordance with an embodiment of the present invention.

FIG. 4 is a timing diagram that schematically shows signals involved in reading out bits stored in cell 22 using the circuit of FIG. 3, in accordance with an embodiment of the present invention. $V_{BL}$ generator 40 outputs a precharge voltage pulse (VG) starting at time $T_0$, with an amplitude A that is determined by controller 48. The word line (WL) control gate voltage is applied to word line 26 at time $T_1$, after the precharge is complete. During the precharge pulse, the bit line current (BL) increases, and then it begins to decay upon application of the control gate voltage on the word line. (Although FIG. 4 shows bit line current, the bit line voltage behaves in the same manner.) The rate of decay depends, as noted above, on the source-drain resistance of cell 22, which in turn depends on the analog value stored in the cell.

Controller 48 applies a sampling pulse (SAMP) to latch 46 at time $T_S$ following $T_1$, thus causing the latch to record a digital value LAT corresponding to the present output of sense amplifier 44. If the bit line current (which depends, of course, on the bit line voltage) is above the threshold value $I_{TH}$ at $T_S$, the latch records a 0. In the example shown in FIG. 4, the bit line current has dropped below the threshold at $T_S$, and the latch will therefore record a 1. Each latched value corresponds to one of the bits stored in cell 22, which is then read out of array 20 for subsequent processing (possibly by decoder 30—FIG. 1).

Controller 48 drives $V_{BL}$ generator 40 and latch 46 to determine the analog value that is stored in cell 22 in a process of successive approximation. This process may take place both when data are to be read out of cells 22 and to verify that data have been written to the cells correctly, in a program-and-verify operation. In each step of the process, the controller may modify one or more sampling parameters, including the precharge voltage V1 or the sampling time SAMP, or both. In addition, the controller may optionally modify $I_{TH}$ and may also control the word line voltage WL, although it is not necessary to control either $I_{TH}$ or WL for the successive approximation method that is described herein.

In the first step of successive approximation of the analog value in a given cell 22, controller 48 typically has no information regarding the state of the cell, i.e., the cell could be in any one of states 36 (FIG. 2). Therefore, the controller uses preset values of V1 and SAMP, which are chosen so as to distinguish between the upper set of states (voltage above ΔV in FIG. 2) and the lower set (below ΔV). The resultant latch value, LAT1, indicates whether the cell voltage is in the upper or lower range, and thus whether the LSB stored in the cell is 0 or 1. The LSB may be output by R/W unit 24 (to decoder 30 or to a host processor—not shown) prior to or in parallel with the next steps of the successive approximation.

Based on LAT1, controller 48 selects the value of V1 and/or SAMP to be used in the next step. The rationale for and results of this selection are explained below with reference to FIGS. 5 and 6. Typically, at least one of the sampling parameters (V1 and/or SAMP) is set to a different value in the next step from its value in the first step. Using this new parameter value, latch 46 records a new latch value, LAT2, which indicates whether the middle bit stored in the cell is 0 or 1. In the three-bit-per-cell example shown above, the controller finally uses the value LAT2, as well as LAT1, in setting the sampling parameter values for the third step of approximation, and thus latches and reads out the MSB. The middle bit may be read out prior to or in parallel with the approximation step that is used to find the MSB. Optionally, for purposes of error correction, the controller may drive a further step of even finer approximation, as described hereinbelow with reference to FIG. 7.

Controller 48 may comprise a hard-wired logic circuit, which selects and outputs the appropriate values of V1 and/or SAMP at each point in the process of successive approximation. Alternatively, the controller may comprise a programmable processing component, which may also perform other control and processing functions, or a combination of hard-wired and programmable elements. In one embodiment, the controller uses a look-up table (LUT) to determine the values of sampling parameters based on the previous latch values. The controller may be configured to drive and control a single readout circuit, as shown in FIG. 3, or it may alternatively control multiple readout circuits in parallel, thus serving multiple bit lines of array 20.

Figure 5:
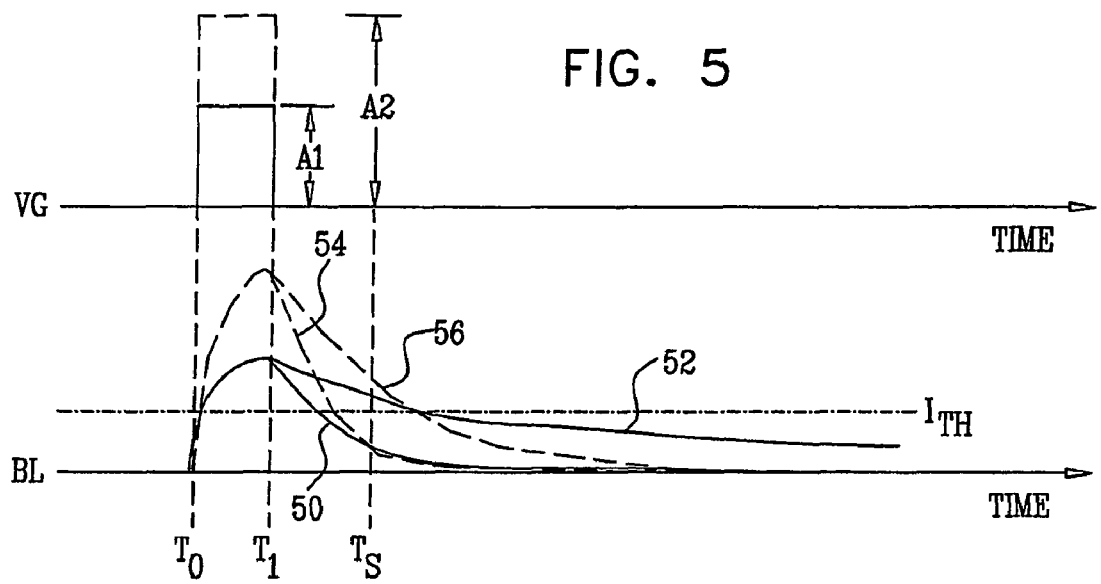
FIG. 5 is a timing diagram that schematically shows signals used in reading out bits from a memory cell using a method of successive approximation, in accordance with an embodiment of the present invention.

FIG. 5 is a timing diagram that schematically shows signals used in reading out bits stored in memory cell 22 using successive approximation with varying bit line precharge, in accordance with an embodiment of the present invention. This diagram assumes that the first successive approximation step has been completed and has yielded a certain latch value LAT1, corresponding to the LSB stored in the cell. Depending on LAT1, controller 48 sets the precharge voltage VG that is to be applied to bit line 28 in the next approximation step to one of two possible values: A1 if LAT1=1, or A2 if LAT1=0. Referring to FIG. 2, A1 is chosen to distinguish between the two sub-ranges below ΔV, while A2 is chosen to distinguish between the two sub-ranges above ΔV.

When LAT1=1 and precharge A1 is applied by $V_{BL}$ generator 40, the bit line voltage will decay after time T1 roughly along a curve 50 if the middle bit of cell 22 has the value 1; or roughly along a curve 52 if the middle bit has the value 0. At time $T_S$, when latch 46 is triggered, curve 50 is below the threshold $I_{TH}$, whereas curve 52 is above the threshold. Thus, decay along curve 50 will yield a new latch value LAT2=1, corresponding to the two lowest states (111 and 011 in FIG. 2) whereas curve 52 will yield LAT2=0, corresponding to the two upper states in the lower range (001 and 101). (In fact, each of the four states below ΔV will give its own decay curve, with the two curves due to states 111 and 011 below $I_{TH}$ at $T_S$, and the other two curves above, but only curves 50 and 52 are shown in FIG. 5 for the sake of simplicity.)

On the other hand, when LAT1=0 and the greater precharge A2 is applied, the bit line voltage will decay roughly along a curve 54 if the middle bit has the value 0, and roughly along a curve 56 if the middle bit has the value 1. In other words, curve 54 will yield LAT2=1, corresponding to states 100 and 000, while curve 56 will yield LAT2=0, corresponding to states 010 and 110. (In this case, because of the coding scheme used in FIG. 2, the value of the middle bit is complementary to the latched value.)

The values of LAT1 and LAT2 are then used by controller 48 in a similar fashion to determine the precharge voltage levels that will be applied in approximating the MSB.

Figure 6:
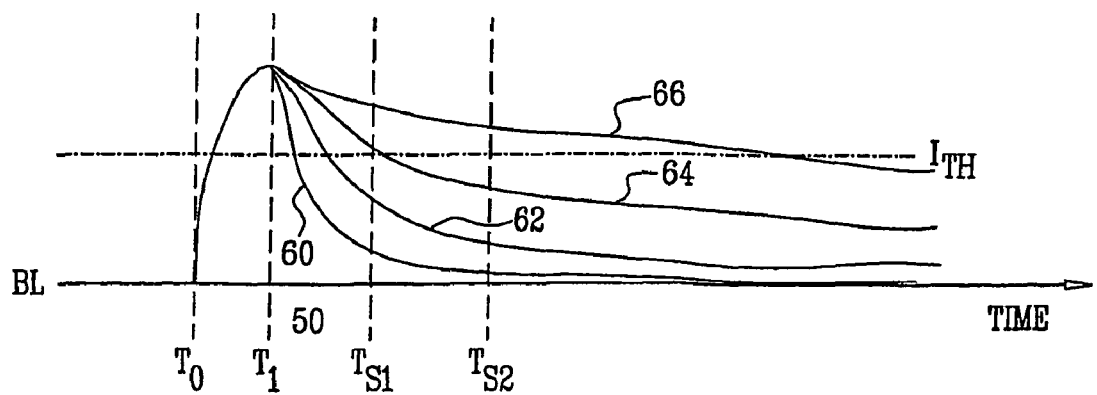
FIG. 6 is a timing diagram that schematically shows signals used in reading out bits from a memory cell using a method of successive approximation, in accordance with another embodiment of the present invention.

FIG. 6 is a timing diagram that schematically shows signals used in reading out bits stored in memory cell 22 using successive approximation with varying sampling delay, in accordance with another embodiment of the present invention. In this case, it is assumed that the precharge voltage VG (not shown in FIG. 6) is constant in successive steps of the approximation, and only the sampling time changes based on the previous latch value. Curves 60, 62, 64 and 66 correspond to the decay of bit line voltage in four different states (or groups of states) of cell 22. Thus, for example, curve 60 could correspond to the average decay of states 111 and 011 in FIG. 2, curve 62 to states 001 and 101, curve 64 to states 100 and 000, and curve 66 to states 010 and 110. In actuality, as explained above, there will be eight different curves, corresponding to the eight different states of the cell, which are resolved in three steps of successive approximation.

In the embodiment illustrated by FIG. 6, controller 48 initially sets the sampling time SAMP to a delay $T_{S1}$. At this sampling time, curves 60 and 62 are below $I_{TH}$, and thus will give LAT1=1, whereas curves 64 and 66 are above $I_{TH}$, and thus will give LAT1=0. Assuming LAT1=0, controller 48 increases the sampling time for the next step to $T_{S2}$. At this greater sampling time, curve 64 will give LAT2=1, whereas curve 66 will give LAT2=0. On the other hand, if LAT1=0, controller 48 will decrease the sampling time in order to distinguish between curves 60 and 62.

Successive Approximation Interleaved with Decoding

Figure 7:
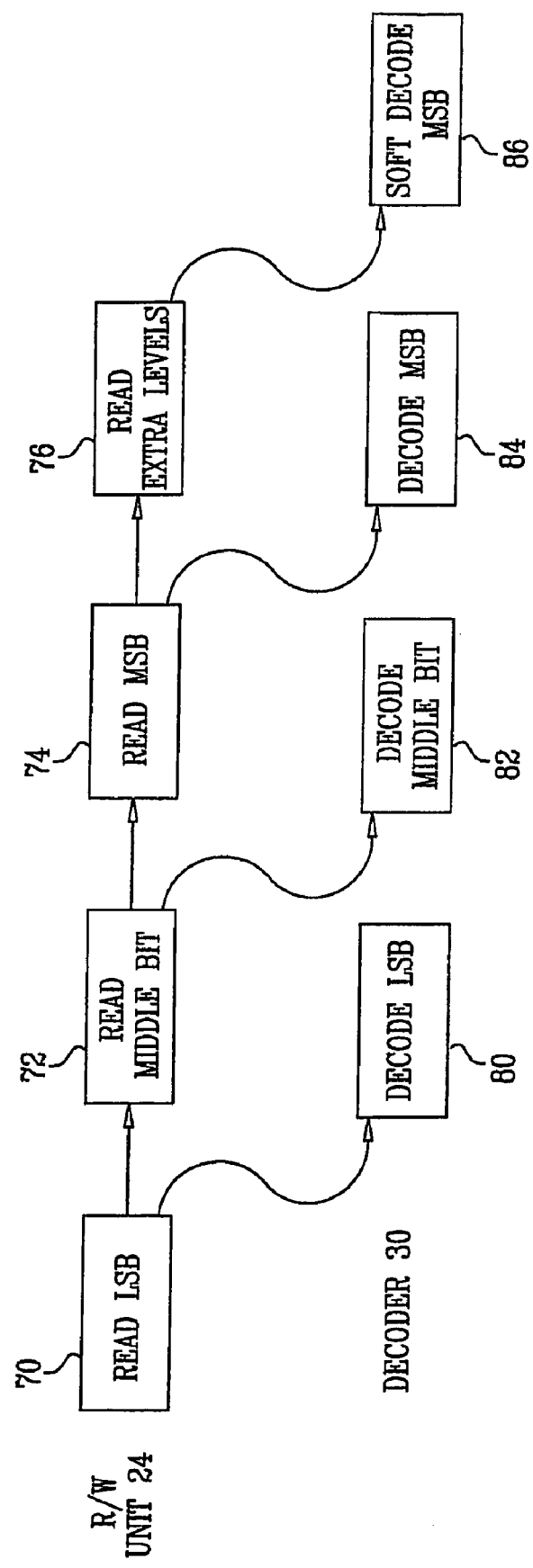
FIG. 7 is a flow chart that schematically illustrates a method for parallel reading and decoding of data stored in a memory array, in accordance with an embodiment of the present invention.

FIG. 7 is a flow chart that schematically illustrates a method for parallel reading and decoding of data stored in memory array 20, in accordance with an embodiment of the present invention. This method is again described on the assumption that cells 22 of array 20 each can store three bits, but the principles embodied in the method may similarly be applied to any suitable sort of MLC analog memory.

R/W unit 24 reads out the LSB from each of a group of cells 22, at a LSB reading step 70. In the case of Flash memory, the set of bits that is read out at step 70 may conveniently constitute a page of data. Unit 24 performs the readout using the method of successive approximation that is defined hereinabove, whereby the LSB is read out of each cell before the approximation of the middle bit has been completed. The R/W unit subsequently reads out the middle bit and the MSB of each cell, in middle bit reading and MSB reading steps 72 and 74, respectively.

Decoder 30 decodes the page (or other group) of LSB data, at a LSB decoding step 80. For example, if the page contains an error correcting code (ECC), the decoder may perform error correction to recover the actual data word encoded in the page, as described in the above-mentioned PCT Patent Application PCT/IL2007/000580. This decoding step may take place in parallel with reading step 72. Similarly, decoder 30 may decode the page of middle-bit data, at a middle bit decoding step 82, in parallel with reading step 74. The page of MSB data is decoded subsequently, at a MSB decoding step 84.

In some cases, the decoder may not be able to successfully decode one (or more) of the pages of data at step 80, 82 or 84. This sort of failure may occur, for example, when distortion causes the readout errors too severe for the ECC to correct. (In the example shown in FIG. 7, it is assumed that the failure occurred in decoding the MSB page, but the approach described below may be applied to any of the pages.) In such cases, controller 48 may invoke an additional approximation step 76. At this step the sampling parameters (such as the precharge voltage, sampling delay and/or threshold) may be adjusted to intermediate values, between the values that were used at step 74, and the sampling process described above may be repeated. These intermediate values of the sampling parameters are not necessarily in the middle of the intervals between the previous values, but may rather be set at any point between the previous values. It may be advantageous, in fact, to choose intermediate values that are near certain previous values in order to give enhanced resolution in the vicinity of the boundaries between states 36 (FIG. 2).

The combined results of steps 74 and 76 effectively provide a readout of the analog value in cell 22 with enhanced resolution—sixteen resolution levels, rather than just eight. The high-resolution readout results of step 76 may then be used to determine the correct MSB data in a soft decoding process, at a soft decoding step 86. This sort of soft decoding is described, for example, in the above-mentioned PCT Patent Application PCT/IL2007/000580 or in another PCT patent application, filed on even date, entitled, "Reading Memory Cells Using Multiple Threshold$_{[DK2]S}$," which is assigned to the assignee of the present patent application, and whose disclosure is incorporated herein by reference.

As noted earlier, although step 86 refers specifically to decoding of the MSB data, this same sort of high-resolution soft decoding may equally be applied to the LSB or middle bit data. As another alternative, multiple pages may be jointly coded with an ECC, and then jointly decoded using the high-resolution results provided by step 76.

Although array 20 is described above, for the sake of convenience and clarity, as comprising certain types of Flash memory cells 22, with associated circuits in a particular configuration, the principles of successive approximation that are embodied in array 20 may similarly be applied to memory devices and systems of other types. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for operating a memory, comprising:
   storing analog values in an array of analog memory cells, so that each of the analog memory cells holds an analog value corresponding to at least first and second respective bits, the array comprising word lines and bit lines connected to the analog memory cells;
   obtaining a first indication of the analog value stored in a given analog memory cell by precharging a bit line connected to the given analog memory cell to a first precharge voltage, and then sampling a first current on the bit line;
   obtaining a second indication of the analog value stored in the given analog memory cell by precharging the bit line connected to the given analog memory cell to a second precharge voltage, which is dependent upon the first indication, and then sampling a second current on the bit line; and
   reading out the first and second respective bits from the given analog memory cell responsively to the first and second indications.

2. The method according to claim 1, wherein the first indication is indicative of the first respective bit stored in the given analog memory cell, and the second indication is indicative of the second respective bit stored in the given analog memory cell.

3. The method according to claim 2, wherein reading out the first and second respective bits comprises reading out the first respective bit prior to sampling the second current.

4. The method according to claim 3, wherein the first respective bit belongs to a first page of data, and the second respective bit belongs to a second page of data, and wherein the method comprises using the first respective bit read out from the given analog memory cell to decode the first page of the data while obtaining the second indication.

5. The method according to claim 1, wherein sampling the first current comprises comparing the first current to a predetermined threshold.

6. The method according to claim 5, wherein precharging the bit line connected to the given analog memory cell to the second precharge voltage comprises setting the second precharge voltage to a first level when the first current is below the predetermined threshold, and setting the second precharge voltage to a second level, greater than the first level, when the first current is above the predetermined threshold.

7. The method according to claim 5, wherein the predetermined threshold is a first threshold, and wherein sampling the second current comprises comparing the second current to a second threshold, which is different from the first threshold.

8. The method according to claim 1, and comprising obtaining a third indication of the analog value stored in the given analog memory cell by precharging the bit line connected to the given analog memory cell to a third precharge voltage, which is dependent upon at least the second indication, and then sampling a third current on the bit line, and reading out at least a third bit from the given analog memory cell responsively to the third indication.

9. The method according to claim 1, and comprising decoding data comprising at least one of the first and second respective bits that have been read out from the given analog memory cell, and upon occurrence of a failure in decoding the data, obtaining a third indication of the analog value stored in the given analog memory cell using a set of sampling parameters that is dependent upon at least the second indication, and then decoding the data using the third indication together with at least one of the first and second indications.

10. The method according to claim 1, wherein sampling the first current comprises applying a predetermined control voltage to a word line connected to the given analog memory cell in order to cause the given analog memory cell to conduct the first current, and wherein sampling the second current comprises applying the same predetermined control voltage to the word line connected to the given analog memory cell in order to cause the given analog memory cell to conduct the second current.

11. The method according to claim 1, wherein sampling the first current comprises sampling the first current on the bit line after a first delay, and wherein sampling the second current comprises sampling the second current on the bit line after a second delay, which is dependent upon the first indication.

12. A method for operating a memory, comprising:
storing analog values in an array of analog memory cells, so that each of the analog memory cells holds an analog value corresponding to at least first and second respective bits, the array comprising word lines and bit lines connected to the analog memory cells;
obtaining a first indication of the analog value stored in a given analog memory cell by precharging a bit line connected to the given analog memory cell, and then sampling a first current on the bit line after a first delay;
obtaining a second indication of the analog value stored in the given analog memory cell by precharging the bit line connected to the given analog memory cell, and then sampling a second current on the bit line after a second delay, which is dependent upon the first indication; and
reading out the first and second respective bits from the given analog memory cell responsively to the first and second indications.

13. The method according to claim 12, wherein the first indication is indicative of the first respective bit stored in the given analog memory cell, and the second indication is indicative of the second respective bit stored in the given analog memory cell.

14. The method according to claim 13, wherein reading out the first and second respective bits comprises reading out the first respective bit prior to sampling the second current.

15. The method according to claim 14, wherein the first respective bit belongs to a first page of data, and the second respective bit belongs to a second page of data, and wherein the method comprises using the first respective bit read out from the given analog memory cell to decode the first page of the data while obtaining the second indication.

16. The method according to claim 12, wherein sampling the first current comprises comparing the first current to a predetermined threshold.

17. The method according to claim 16, wherein sampling the second current comprises setting the second delay to a first delay time when the first current is below the predetermined threshold, and setting the second delay to a second delay time, greater than the first delay time, when the first current is above the predetermined threshold.

18. The method according to claim 16, wherein the predetermined threshold is a first threshold, and wherein sampling the second current comprises comparing the second current to a second threshold, which is different from the first threshold.

19. The method according to claim 12, and comprising obtaining a third indication of the analog value stored in the given analog memory cell by precharging the bit line connected to the given analog memory cell, and then sampling a third current on the bit line after a third, which is dependent upon at least the second indication, and reading out at least a third bit from the given analog memory cell responsively to the third indication.

20. The method according to claim 12, and comprising decoding data comprising at least one of the first and second respective bits that have been read out from the given analog memory cell, and upon occurrence of a failure in decoding the data, obtaining a third indication of the analog value stored in the given analog memory cell using a set of sampling parameters that is dependent upon at least the second indication, and then decoding the data using the third indication together with at least one of the first and second indications.

21. The method according to claim 12, wherein sampling the first current comprises applying a predetermined control voltage to a word line connected to the given analog memory cell in order to cause the given analog memory cell to conduct the first current, and wherein sampling the second current comprises applying the same predetermined control voltage to the word line connected to the given analog memory cell in order to cause the given analog memory cell to conduct the second current.

22. A method for operating a memory, comprising:
storing analog values in a group of analog memory cells, so that each of the analog memory cells holds an analog value corresponding to at least first and second respective bits belonging respectively to first and second pages of data;
obtaining a first indication of the analog value stored in a given analog memory cell by sampling the given analog memory cell using a first set of sampling parameters, wherein the first indication is indicative of the first respective bit stored in the given analog memory cell;
obtaining a second indication of the analog value stored in the given analog memory cell by sampling the given analog memory cell using a second set of sampling parameters, which is dependent upon the first indication, wherein the second indication is indicative of the second respective bit stored in the given analog memory cell; and
reading out the first bit from the given analog memory cell responsively to the first indication, and decoding the first page of the data using the first bit while obtaining the second indication.

23. The method according to claim 22, and comprising, upon occurrence of a failure in decoding one of the pages of the data, obtaining a third indication of the analog value stored in the given analog memory cell using a third set of sampling parameters that is dependent upon at least the second indication, and then decoding the one of the pages using the third indication together with at least one of the first and second indications.

24. Memory apparatus, comprising:
an array of analog memory cells, which are configured to store analog values so that each of the analog memory cells holds an analog value corresponding to at least first and second respective
readout circuitry, which is connected to the word lines and the bit lines and is configured to obtain first and second indications of the analog value stored in the given memory cell by precharging a bit line connected to the given analog memory cell to a first precharge voltage and then sampling a first current on the bit line so as to obtain the first indication, and precharging the bit line connected to the given analog memory cell to a second precharge voltage, which is dependent upon the first indication, and then sampling a second current on the bit line so as to obtain the seconding indication, and which is configured to read out the first and second respective bits from the given analog memory cell responsively to the first and second indications.

25. The apparatus according to claim 24, wherein the first indication is indicative of the first respective bit stored in the given analog memory cell, and the second indication is indicative of the second respective bit sorted in the given analog memory cell.

26. The apparatus according to claim 25, wherein the readout circuitry is configured to read out the first respective bit prior to sampling the second current.

27. The apparatus according claim 26, wherein the first respective bit belongs to a first page of data, and the second respective bit belongs to a second page of data wherein the apparatus comprises a decoder, which is configured to decode the first page of the data using the first respective bit read out from the given analog memory cell while the readout circuitry is obtaining the second indication.

28. The apparatus according to claim 24, wherein the readout circuitry is configured to sample the first current by comparing the first current to a predetermined threshold.

29. The apparatus according to claim 28, wherein the readout circuitry is configured to set the second precharge voltage to a first level when the first current is below the predetermined threshold, and to set the second precharge voltage to a second level, greater than the first level, when the first current is above the predetermined threshold.

30. The apparatus according to claim 28, wherein the predetermined threshold is a first threshold, and wherein the readout circuitry is configured to compare the second current to a second threshold, which is different from the first threshold.

31. The apparatus according to claim 24, wherein the readout circuitry is configured to obtain a third indication of the analog value stored in the given analog memory cell by precharging the bit line connected to the given analog memory cell to a third precharge voltage, which is dependent upon at least the second indication, and then sampling a third current on the bit line, and reading out at least a third bit from the given analog memory cell responsively to the third indication.

32. The apparatus according to claim 24, and comprising a decoder, which is coupled to decode data comprising at least one of the first and second respective bits that have been read out from the given analog memory cell, wherein upon occurrence of a failure in decoding the data, the readout circuitry is operative to obtain a third indication of the analog value stored in the given analog memory cell using a set of sampling parameters that is dependent upon at least the second indication, and the decoder is operative to decode the data using the third indication together with at least one of the first and second indications.

33. The apparatus according to claim 24, wherein the readout circuitry is configured to sample the first current by applying a predetermined control voltage to a word line connected to the given analog memory cell in order to cause the given analog memory cell to conduct the first current, and to apply the same predetermined control voltage to the word line connected to the given analog memory cell in order to cause the given analog memory cell to conduct the second current.

34. The apparatus according to claim 24, wherein the readout circuitry is configured to sample the first current on the bit line after a first delay, and to sample the second current on the bit line after a second delay, which is dependent upon the first indication.

35. Memory apparatus, comprising:

an array of analog memory cells, which are configured to store analog values so that each of the analog memory cells holds an analog value corresponding to at least first and second respective bits, the array comprising word lines and bit lines connected to the analog memory cells; and readout circuitry, which is connected to the word lines and the bit lines and is configured to obtain first and second indications of the analog value stored in the given memory cell by precharging a bit line connected to the given analog memory cell and then sampling a first current on the bit line after a first delay so as to obtain the first indication, and precharging the bit line connected to the given analog memory cell and then sampling a second current on the bit line after a second delay, which is dependent upon the first indication so as to obtain the second indication, and which is configured to read out the first and second respective bits from the given analog memory cell responsively to the first and second indications.

36. The apparatus according to claim 35, wherein the first indication is indicative of the first respective bit stored in the given analog memory cell, and the second indication is indicative of the second respective bit stored in the given analog memory cell.

37. The apparatus according to claim 36, wherein the readout circuitry is configured to read out the first respective bit prior to sampling the second current.

38. The apparatus according to claim 37, wherein the first respective bit belongs to a first page of data, and the second respective bit belongs to a second page of data, and wherein the apparatus comprises a decoder, which is configured to decode the first page of the data using the first respective bit read out from the given analog memory cell while the readout circuitry is obtaining the second indication.

39. The apparatus according to claim 35, wherein the readout circuitry is configured to sample the first current by comparing the first current to a predetermined threshold.

40. The apparatus according to claim 39, wherein the readout circuitry is configured to set the set the second delay to a first delay time when the first current is below the predetermined threshold, and to set the second delay to a second delay time, greater than the first delay time, when the first current is above the predetermined threshold.

41. The apparatus according to claim 39, wherein the predetermined threshold is a first threshold, and wherein the readout circuitry is configured to compare the second current to a second threshold, which is different from the first threshold.

42. The apparatus according to claim 35, wherein the readout circuitry is configured to obtain a third indication of the analog value stored in the given analog memory cell by precharging the bit line connected to the given analog memory cell to a third precharge voltage, which is dependent upon at least the second indication, and then sampling a third current on the bit line, and reading out at least a third bit from the given analog memory cell responsively to the third indication.

43. The apparatus according to claim 35, and comprising a decoder, which is coupled to decode data comprising at least one of the first and second respective bits that have been read out from the given analog memory cell, wherein upon occurrence of a failure in decoding the data, the readout circuitry is operative to obtain a third indication of the analog value stored in the given analog memory cell using a set of sampling parameters that is dependent upon at least the second indication, and the decoder is operative to decode the data using the third indication together with at least one of the first and second indications.

44. The apparatus according to claim 35, wherein the readout circuitry is configured to sample the first current by applying a predetermined control voltage to a word line connected to the given analog memory cell in order to cause the given analog memory cell to conduct the first current, and to apply the same predetermined control voltage to the word line connected to the given analog memory cell in order to cause the given analog memory cell to conduct the second current.

45. Memory apparatus, comprising:
- a group of analog memory cells, which are configured to store analog values so that each of the analog memory cells holds an analog value corresponding to at least first and second respective bits belonging respectively to first and second pages of data;
- readout circuitry, which is coupled to the analog memory cells and is configured to obtain a first indication of the analog value stored in a given analog memory cell by sampling the given analog memory cell using a first set of sampling parameters, wherein the first indication is indicative of the first respective bit stored in the given analog memory cell, and to obtain a second indication of the analog value stored in the given analog memory cell by sampling the given analog memory cell using a second set of sampling parameters, which is dependent upon the first indication, wherein the second indication is indicative of the second respective bit stored in the given analog memory cell; and
- a decoder, which is coupled to receive the first bit from the readout circuitry and to decode the first page of the data using the first bit while the readout circuitry is obtaining the second indication.

46. The apparatus according to claim 45, wherein upon occurrence of a failure in decoding one of the pages of the data, the readout circuit is operative to obtain a third indication of the analog value stored in the given analog memory cell using a third set of sampling parameters that is dependent upon at least the second indication, and the decoder is operative to decode the one of the pages using the third indication together with at least one of the first and second indications.

* * * * *